(12) United States Patent
He et al.

(10) Patent No.: US 10,637,636 B2
(45) Date of Patent: Apr. 28, 2020

(54) JITTER SENSING AND ADAPTIVE CONTROL OF PARAMETERS OF CLOCK AND DATA RECOVERY CIRCUITS

(71) Applicant: Intel Corporation, Santa Clara, CA (US)

(72) Inventors: Yun He, Fremont, CA (US); Adhiveeraraghavan Srikanth, El Dorado Hills, CA (US); Sanjib Sarkar, El Dorado Hills, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/356,722

(22) Filed: Mar. 18, 2019

(65) Prior Publication Data

US 2019/0349184 A1 Nov. 14, 2019

Related U.S. Application Data

(63) Continuation of application No. 15/979,219, filed on May 14, 2018, now Pat. No. 10,237,051.

(51) Int. Cl.
*H04L 7/033* (2006.01)
*H04L 7/00* (2006.01)
*H03L 7/093* (2006.01)
*H03L 7/08* (2006.01)

(52) U.S. Cl.
CPC .......... *H04L 7/0008* (2013.01); *H03L 7/0807* (2013.01); *H03L 7/093* (2013.01); *H04L 7/0016* (2013.01); *H04L 7/0332* (2013.01);
*H04L 7/0025* (2013.01); *H04L 7/0062* (2013.01); *H04L 7/033* (2013.01)

(58) Field of Classification Search
CPC ........ H04L 1/205; H04L 7/033; H04L 7/0331
See application file for complete search history.

(56) References Cited

U.S. PATENT DOCUMENTS

2015/0103961 A1 4/2015 Malipatil et al.
2015/0188551 A1* 7/2015 Aziz ..................... H04L 7/0058
375/375

* cited by examiner

*Primary Examiner* — Kevin Kim
(74) *Attorney, Agent, or Firm* — Lowenstein Sandler LLP

(57) ABSTRACT

In accordance with embodiments disclosed herein, there is provided systems and methods for jitter sensing and adaptive control of parameters of clock and data recovery (CDR) circuits. A receiver component includes an adaptive CDR loop dynamic control circuit. The adaptive CDR loop dynamic control circuit is to detect first sinusoidal jitter at a first frequency and a first amplitude and update parameters of the CDR circuit to a first plurality of values based on the first frequency and the first amplitude. The adaptive CDR loop dynamic control circuit is further to detect second sinusoidal jitter at a second frequency and a second amplitude and update the parameters of the CDR circuit to a second plurality of values based on the second frequency and the second amplitude. The first sinusoidal jitter is in a first incoming data signal and the second sinusoidal jitter is in a second incoming data signal.

20 Claims, 10 Drawing Sheets

US 10,637,636 B2

JITTER SENSING AND ADAPTIVE CONTROL OF PARAMETERS OF CLOCK AND DATA RECOVERY CIRCUITS

RELATED APPLICATION

This application is a continuation application of U.S. patent application Ser. No. 15/979,219, filed May 14, 2018, the entire content is hereby incorporated by reference.

Figure 6A:
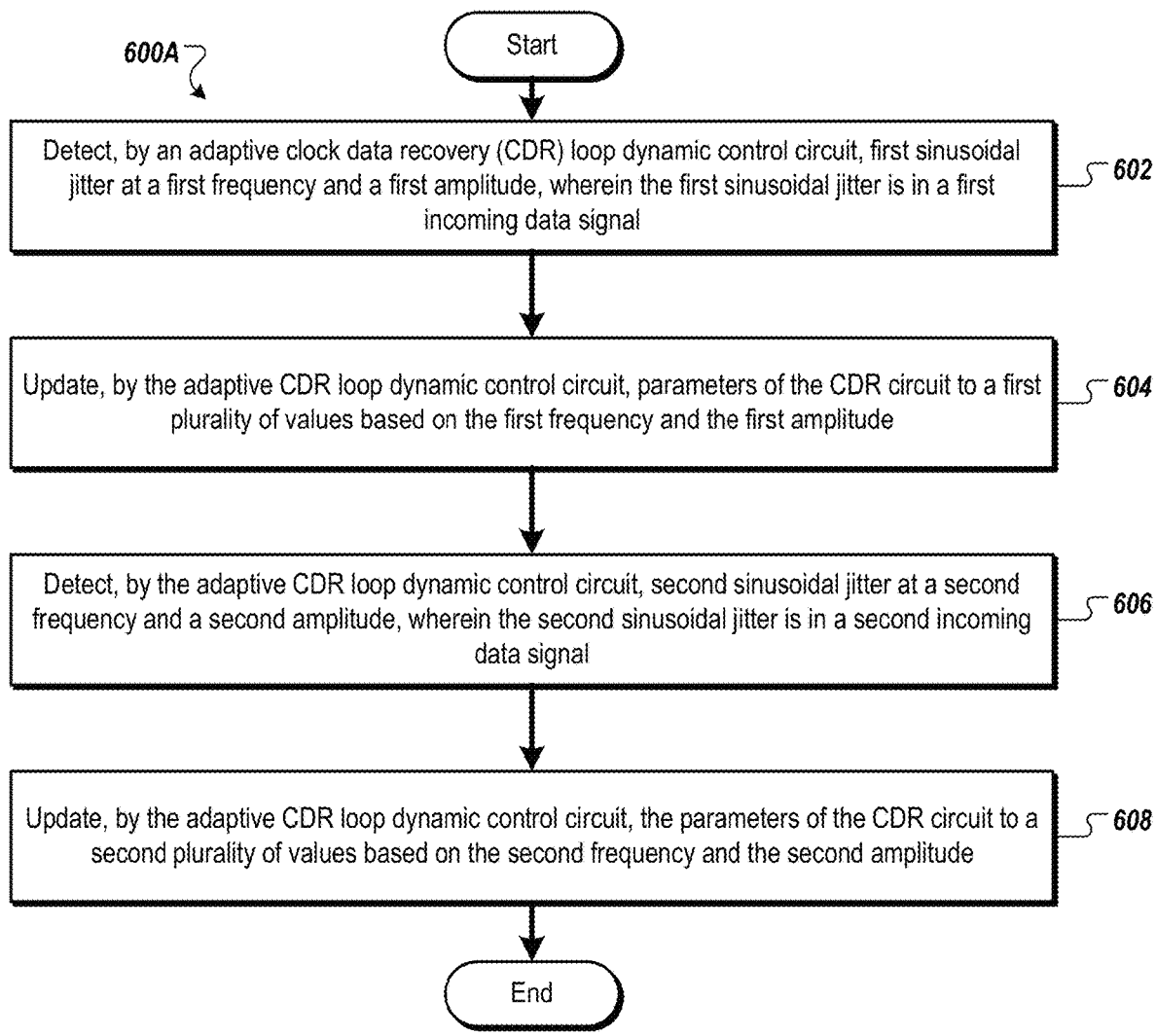
Figure 6B:
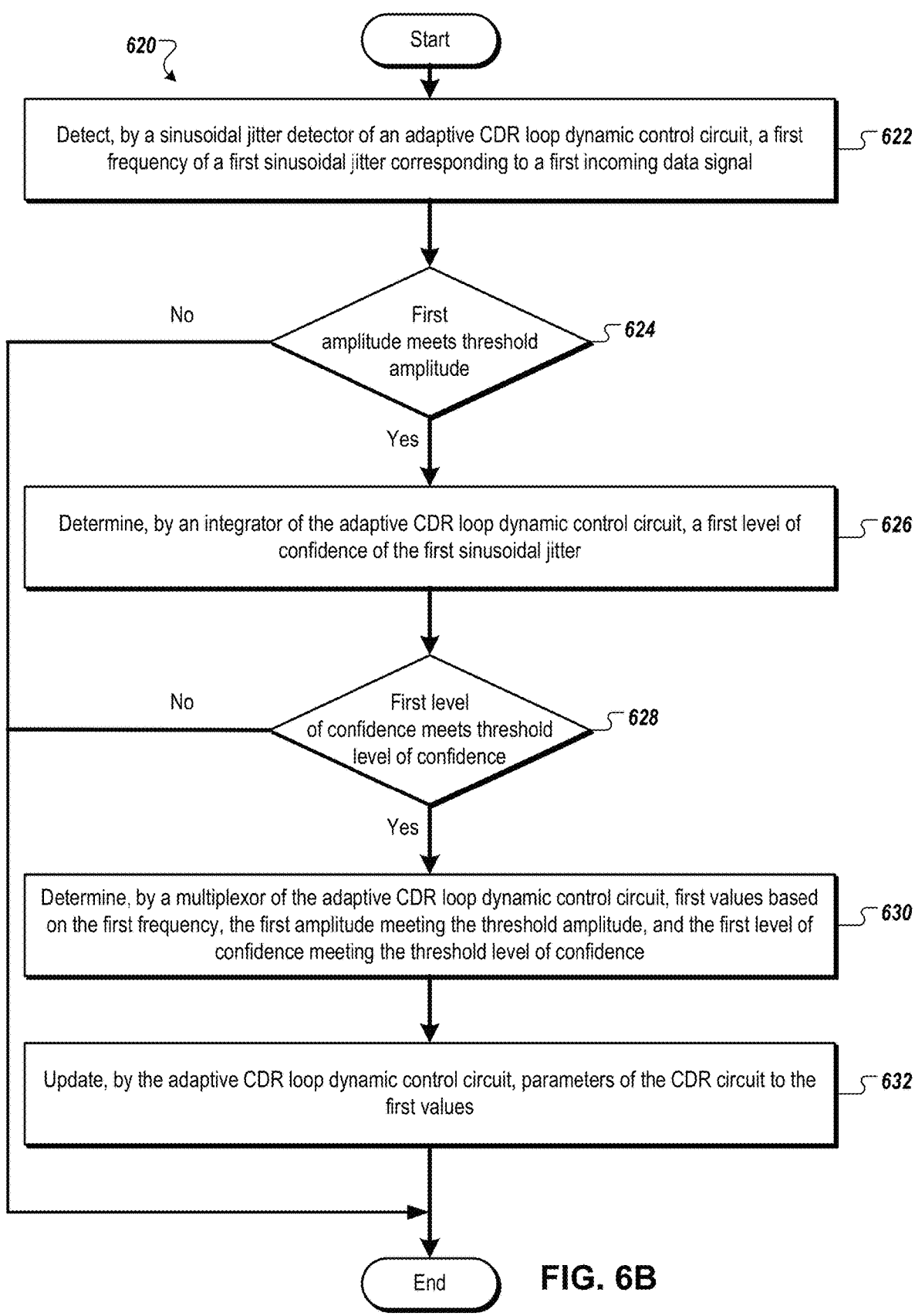
Figure 6C:
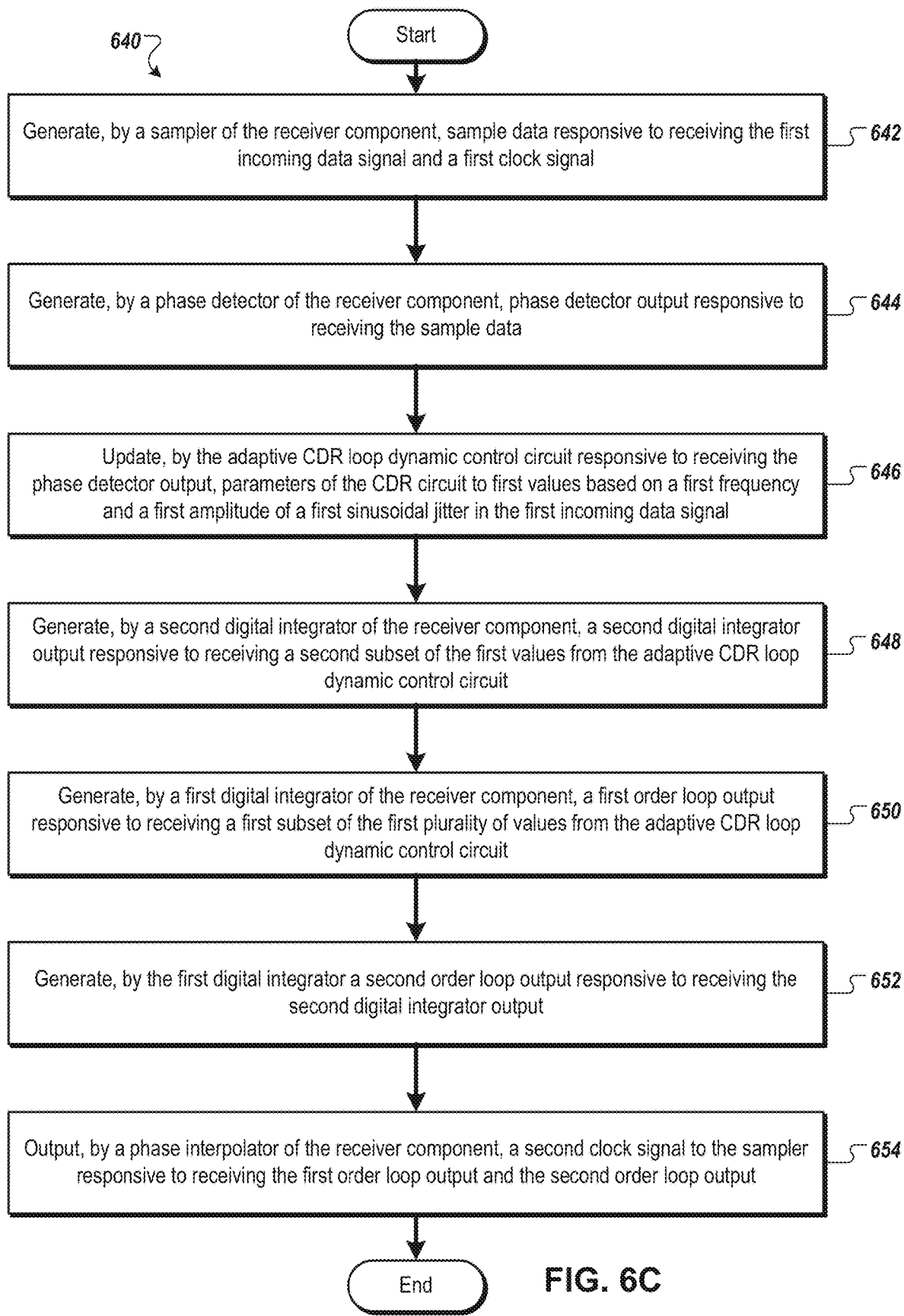

FIGS. 6A-C are flow diagrams of methods of updating parameters of a CDR circuit, according to certain embodiments.

Figure 7:
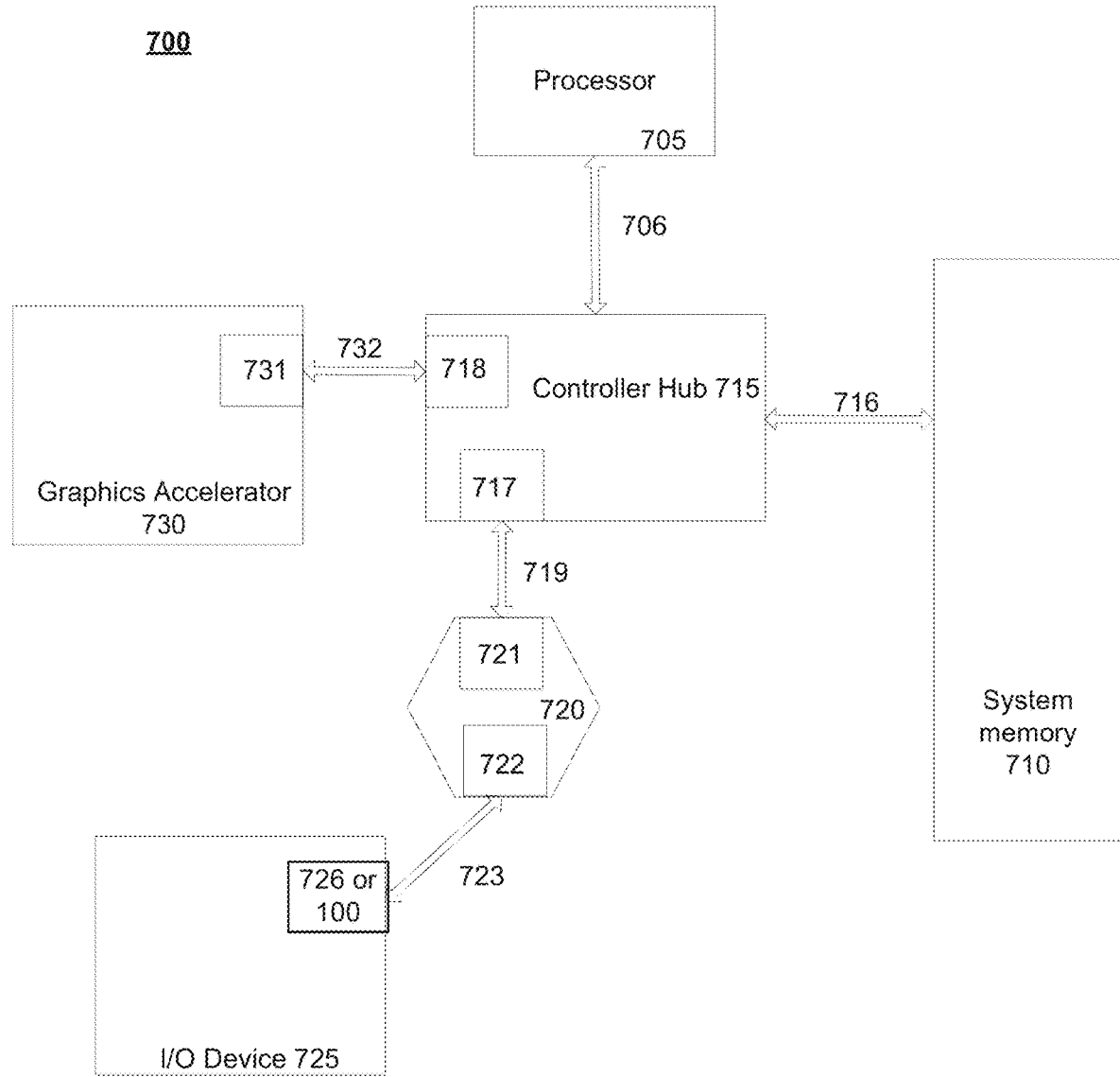

FIG. 7 illustrates a computer system with multiple interconnects, according to one embodiment.

Figure 8:
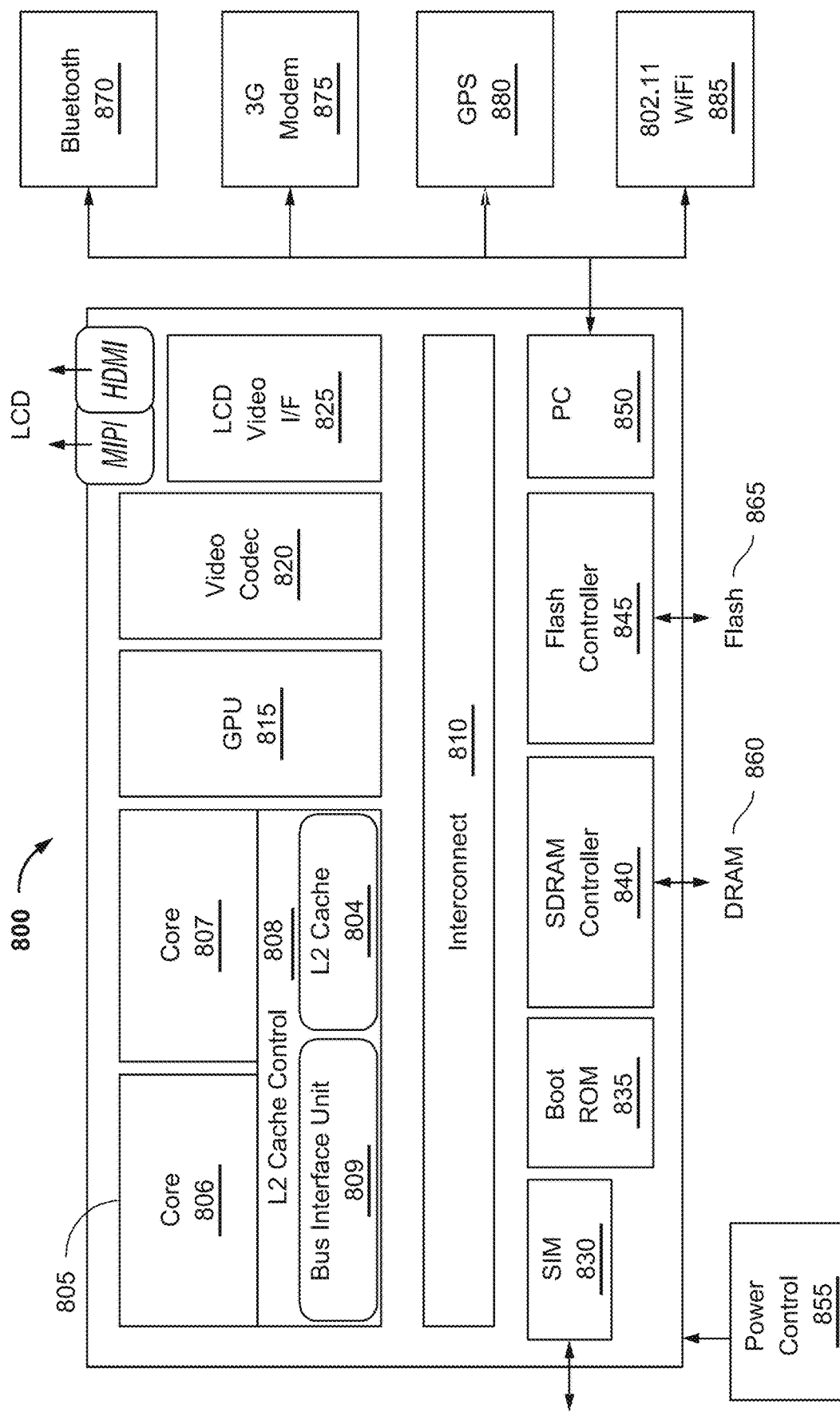

FIG. 8 illustrates a system on a chip (SOC) design, according to one embodiment.

DESCRIPTION OF EMBODIMENTS

Described herein are technologies directed to jitter sensing and adaptive control of parameters of CDR circuits. A system may include a receiver component that receives data signals from a transmitter component. The data signals may be periodic signals in relation to a reference clock signal (e.g., of the transmitter component). Deviations from true periodicity of the periodic signal are referred to as jitter.

A receiver component may include a CDR circuit that generates a clock signal (e.g., based on an incoming data signal) for sampling of incoming data in the incoming data signal. The CDR circuit has parameters (e.g., first and second order loop gains) for generating of the clock signal. The parameters may be set to certain values (e.g., Kp, Ki) which may be effective for certain jitter signals (e.g., a jitter signal of a first frequency and a first amplitude, etc.) and not effective for other jitter signals (e.g., a jitter signal of a second frequency and a second amplitude, etc.). Conventionally, the parameters are fixed during live data traffic (e.g., fixed during receiving of incoming data signals by the receiver component from a transmitter component).

Devices (e.g., devices with high speed serial input/output (HSIO) physical layers (PHY)) may be affected by multiple internal and external sources of jitter. Incoming data may have jitter from different sources including one or more of driving devices (e.g., transmitter component), channel (e.g., link between the receiving component and transmitting component), and components of the system (e.g., clocking source, power supply noise, etc.). The jitter signals from the different sources may have spectrum and amplitude that are different across frequencies. The CDR circuit of a device may be designed with an overshoot in jitter transfer function to amplify jitter signals over certain frequency ranges, but jitter tolerance of the device will degrade if the jitter in the system is in the particular frequency ranges. The CDR circuit of a receiving component may be effective for certain jitter signals and not effective (e.g., not meet specification) for other jitter signals. Devices with HSIO PHYs may experience bit-error rates that are higher than allowed by specification responsive to the jitter amplification being different across frequencies (e.g., due to external injection of jitter, due to silicon design of the receiver component, etc.).

The devices, systems, and methods, as disclosed herein, provide jitter sensing and adaptive control of parameters of CDR circuits. A CDR circuit of a receiver component includes an adaptive CDR loop dynamic control circuit. The adaptive CDR loop dynamic control circuit may detect first sinusoidal jitter (e.g., in a first incoming data signal from a transmitter component) at a first frequency and first amplitude and update parameters of the CDR circuit to first values based on the first frequency and the first amplitude. The adaptive CDR loop dynamic control circuit may detect second sinusoidal jitter (e.g., in a second incoming data signal) at a second frequency and a second amplitude and update the parameters of the CDR circuit to second values based on the second frequency and the second amplitude. By sensing the frequency (e.g., tone) and amplitude of the jitter and adapting the parameters (e.g., first and second order loop gains) of the CDR circuit based on frequency and amplitude of the jitter (e.g., dominant jitter tone frequency), the adaptive CDR loop dynamic control circuit may optimize electrical margins (e.g., voltage margin at extreme bit error rates (BER), eye width of jitter tolerance eye diagram) and reduce bit error ratios (e.g., FIG. 4) of receiver components. The adaptive CDR loop dynamic control circuit may automatically adjust parameters of the CDR circuit during live data traffic. By updating the parameters of the CDR circuit, the receiver component may adapt to meet specification at different amplitudes and frequencies of jitter. The adaptive CDR loop dynamic control circuit may alleviate jitter amplification and may flatten the jitter transfer function above bandwidth of the CDR. Receiver components that include an adaptive CDR loop dynamic control circuit may have an improved jitter tolerance (e.g., in channel compliance tests). Automatic jitter sensing via the adaptive CDR loop dynamic control circuit can be used to detect and automatically adjust systematic jitters in the system (e.g., from clocking sources, from power supply noise).

Figure 1:
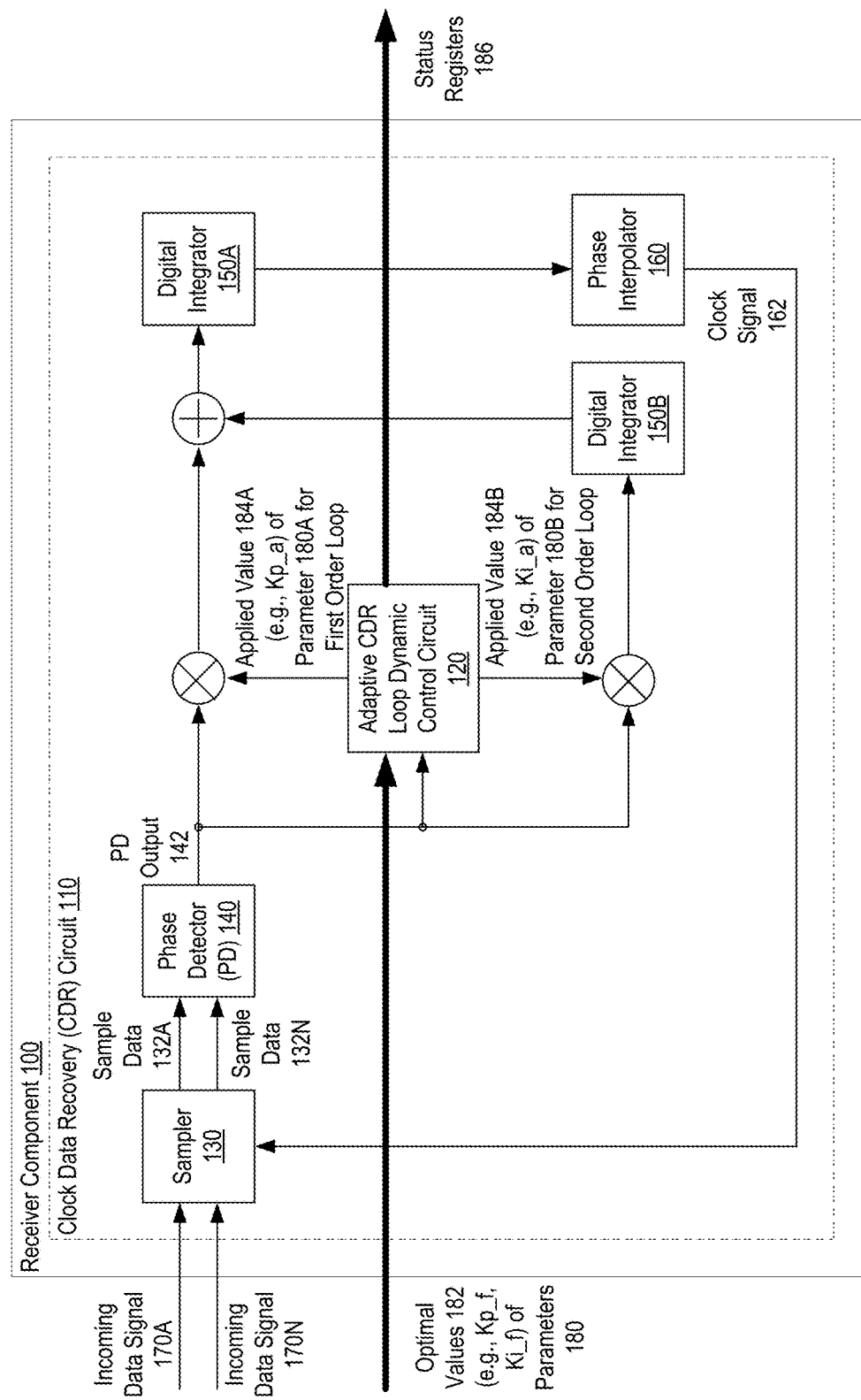
FIG. 1 illustrates a receiver component that includes an adaptive clock and data recovery (CDR) loop dynamic control circuit, according to certain embodiments.

FIG. 1 illustrates a receiver component 100 that includes an adaptive CDR loop dynamic control circuit 120, according to certain embodiments. The receiver component 100 includes one or more samplers 130, a phase detector (PD) 140 (e.g., Alexander P D, Mueller-Müller PD), an adaptive CDR loop dynamic control circuit 120, digital integrators 150A-B (hereinafter referred to as digital integrator 150) (e.g., loop filters), and a phase interpolator 160. The receiver component 100 may include a CDR circuit 110. One or more of the sampler 130, PD 140, adaptive CDR loop dynamic control circuit 120, digital integrator 150, or phase interpolator 160 may be included in a CDR circuit 110.

The CDR circuit 110 may have parameters 180. Optimal values 182 for the parameters are programmable from control registers for each jitter frequency. The optimal values 182 can be fine-tuned for each jitter frequency of interest. The adaptive CDR loop dynamic control circuit 120 may receive optimal values 182 (e.g., Kp_f, Ki_f) for the parameters 180 for different jitter (e.g., different jitter frequencies) and may select applied values 184 (e.g., Kp_a, Ki_a) for the parameters 180 based on the dominant jitter of incoming data signal 170. The adaptive CDR loop dynamic control circuit 120 may provide output to status registers 186 (e.g., output the applied values 184 selected at different points in time, output the applied values 184 selected for different incoming data signals 170, output the percentage of the time different applied values 184 are used, etc.).

Sampler 130 may receive a clock signal 162 from the phase interpolator 160 and one or more incoming data signals 170A-N (hereinafter referred to as "incoming data signal 170") from a transmitter component. The sampler 130 may sample the incoming data signal 170 at intervals based on the clock signal 162 to generate (e.g., output) sample data 132A-N (hereinafter referred to as "sample data 132").

The PD 140 may receive the sample data 132 and may generate PD output 142 (e.g., ϕ).

Figure 2:
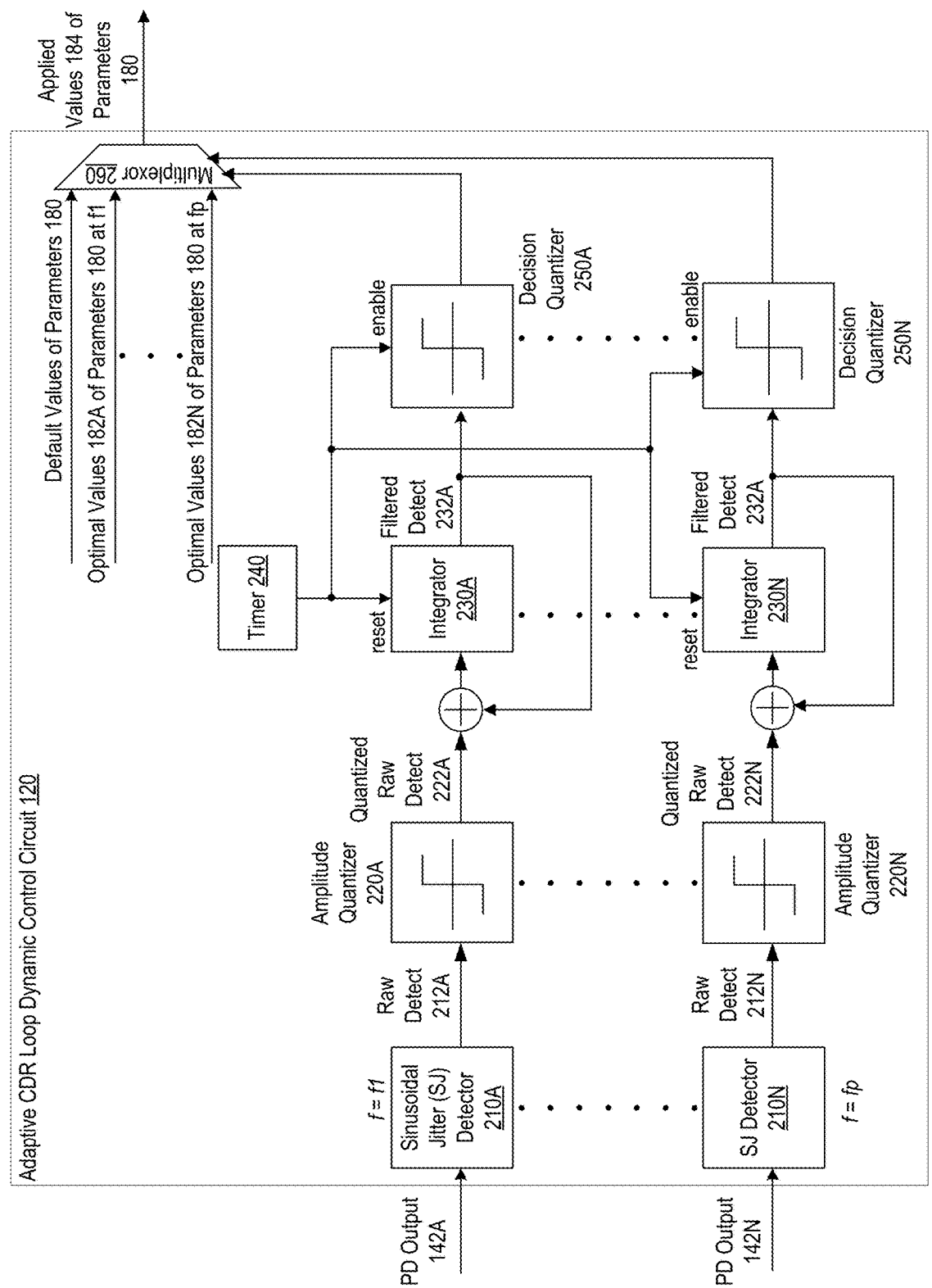
FIG. 2 illustrates an adaptive CDR loop dynamic control circuit, according to certain embodiments.

The adaptive CDR loop dynamic control circuit 120 may receive the PD output 142, detect sinusoidal jitter at multiple frequencies and amplitudes (e.g., of the incoming data signal 170), and update parameters 180 of the CDR circuit 110 to applied values 184 (e.g., Kp_a, Ki_a) based on the detected frequency and amplitude (see FIG. 2).

The digital integrator 150A may receive the first applied parameter (e.g., Kp_a) and may output a first order loop output. The digital integrator 150B may receive the second applied parameter (e.g., Ki_a) and output a second digital integrator output. The digital integrator 150A may receive the second digital integrator output from the digital integrator 150B and output a second order loop output. The applied value 184A (e.g., Kp_a) of parameter 180A may be a first order loop gain and may be routed through a first order loop (e.g., from adaptive CDR loop dynamic control circuit 120 to the digital integrator 150A to the phase interpolator 160). The applied value 184B (e.g., Ki_a) of parameter 180B may be a second order loop gain and may be routed through a second order loop (e.g., from adaptive CDR loop dynamic control circuit 120 to the digital integrator 150B to the digital integrator 150A to the phase interpolator 160). The first order loop may include one digital integrator 150A and the second order loop may include two digital integrators 150A-B. Digital integrator 150A may use the following first integral function:

$$(z^{-1})/(k_1 *(1-z^{-1}))$$

The variable $k_1$ is the built-in gain of the integrator 150A. The applied value 184A Kp_a modulates $k_1$, and determines the first order path gain (Kp_a/$k_1$).

The digital integrator 150A may generate the first order loop output by performing the first integral function on the applied value 184A (e.g., Kp_a) of parameter 180A.

Digital integrator 150B may use the following second integral function:

$$(z^{-1})/(k_2 *(1-z^{-1}))$$

The variable $k_2$ is the built-in gain of the integrator 150B. The applied value 184B Ki_a modulates $k_2$, and determines the second order path gain (Ki_a/$k_2$).

Digital integrators 150A-B may generate the second order loop output by the digital integrator 150B first performing the second integral function on the applied value 184B (e.g., Ki_a) of parameter 180B to generate a second digital integrator output and then the digital integrator 150A performing the first integral function on the second digital integrator output to generate the second order loop output.

The phase interpolator 160 may receive the first order loop output and the second order loop output and may output a clock signal 162 to the sampler 130. As different incoming data signals 170 are received that have different jitter (e.g., one or more of different jitter frequency, different jitter amplitude, at different time, etc.), the phase interpolator 160 may output different clock signals 162 (e.g., clock signals 162 with different frequency and phase, etc.). The clock signal 162 (e.g., current clock signal) may be based on the dominant jitter (e.g., dominant jitter frequency, dominant jitter amplitude, current dominant jitter) of the incoming data signal 170.

The adaptive CDR loop dynamic control circuit 120 may automatically adjust the values 184 of the parameters 180 of the CDR circuit based on frequency and amplitude of jitter (e.g., phase jitters detected in the system). The CDR jitter transfer function may be adaptively shaped to improve performance. A CDR jitter transfer function may refer to the acts performed by the CDR (e.g., using the adaptive CDR loop dynamic control circuit 120, using parameters 180) to receive the incoming data signal 170 and generate a clock signal 162 (e.g., to attenuate the jitter at the jitter frequency, etc.). Use of an adaptive CDR loop dynamic control circuit 120 may improve HSIO receiver margin (e.g., voltage margin at extreme bit error rates (BER), eye width of jitter tolerance eye diagram). Use of an adaptive CDR loop dynamic control circuit 120 may flatten the CDR jitter transfer function beyond bandwidth of the CDR to avoid jitter amplification. Use of an adaptive CDR loop dynamic control circuit 120 may speed up time to market and reduce cost associated with yield improvement. An adaptive CDR loop dynamic control circuit 120 may be used as a detection tool to automatically adjust systematic jitters in the system (e.g., from clocking sources, from power supply noise).

In some embodiments, parameter 180A is a first order loop gain (e.g., a proportional gain) and is represented by Kp. In some embodiments, and parameter 180B is a second order loop gain (e.g., integral gain) and is represented by Ki.

It may be noted that updating parameters 180 is described as updating two parameters of the CDR circuit 110 herein is provided for purposes of illustration, rather than limitation. In some embodiments, the value of only one parameter of the CDR circuit 110 may be updated (e.g., by the adaptive CDR dynamic control circuit 120) based on detected jitter. In some embodiments, the values of more than two parameters of the CDR circuit 110 may be updated (e.g., by the adaptive CDR dynamic control circuit 120) based on the detected jitter. In some embodiments, adaptive CDR loop dynamic control circuit 120 may update one or more parameters of the receiver component 100 (e.g., that are not parameters of a CDR circuit 110) based on the detected jitter. The parameters may include one or more of peaking index of the continuous time linear equalizer (CTLE), bias current in the decision feedback equalizer (DFE), bias current in the variable gain amplifier (VGA), etc. The mechanism of adjusting the receiver parameters (e.g., CTLE peaking index, DFE bias current, etc.) may be the same as the mechanism of adjusting CDR first and second order loop gain (Kp, Ki).

FIG. 2 illustrates an adaptive CDR loop dynamic control circuit 120, according to certain embodiments.

The adaptive CDR loop dynamic control circuit 120 may include one or more sinusoidal jitter (SJ) detectors 210A-N (herein referred to as SJ detector 210). The SJ detector 210 may detect the first frequency of the first sinusoidal jitter in the incoming data signal 170. SJ detector 210 may receive PD output 142 (ϕ(n)) from the PD 140. The SJ detector 210 may output the raw detect 212 ($R_{\phi,f}(n)$) (e.g., raw detect data) based on the PD output 142. The raw detect 212 may indicate a first frequency of the first sinusoidal jitter in the incoming data signal 170.

The SJ detector 210 may calculate raw detect 212 using the equation $R_{\phi,f}(n)$ based on PD output 142 (ϕ(n)) for a given sinusoidal frequency "f". $R_{\phi,f}(n)$ and $\bar{\phi}_{n,f}$ may be calculated using the following equations:

$$R_{\phi,f}(n) = \sum_{m=0}^{7}\sum_{k=1}^{3}(-1)^k(\phi(n-m)-\overline{\phi}_{n,f})\left(\phi\left(n-m-\left[\frac{kf_0}{2f}\right]\right)-\overline{\phi}_{n,f}\right).$$

$$\overline{\phi}_{n,f} = \frac{1}{32}\sum_{m=0}^{7}\sum_{k=0}^{3}\phi\left(n-m-\left[\frac{kf_0}{2f}\right]\right)$$

The variable n represents the time index of the PD output 142, running at the CDR digital loop frequency of $f_0$ (e.g., 1.25 GHz, 2.5 GHz, etc.). Iteration variable m is the time index of the phase error output just before index n. Iteration variable k is the time index of the phase error spaced k-half period away of the sinusoidal jitter. f is the frequency of the SJ tone, (e.g., 15 MHz, 30 MHz, etc.) [·] is the mathematical notation of the nearest integer function. In digital implementation, the real number of the half period may be replaced by its nearest integer. (e.g., 1-half cycle of the SJ may be [1250 M/(2*15 M)]=42.) The raw detect $R_{\phi,f}(n)$ is calculated by accumulating m=0, 1, ... 7, total 8 consecutive phase error multiplication, in which each phase error is multiplied with the phase error spaced k=1, 2, 3, half-period away of the SJ tone. $\overline{\phi}_{n,f}$ is the run-time average of all phase errors (e.g., 8×4=32) involved in the calculation.

The adaptive CDR loop dynamic control circuit 120 may include one or more amplitude quantizers 220A-N (herein referred to as amplitude quantizer 220). Amplitude quantizer 220 may receive the raw detect 212 and determine whether the first amplitude of the first sinusoidal jitter in the incoming data signal 170 meets a threshold amplitude. In some embodiments, responsive to determining whether the first amplitude meets the threshold amplitude, the amplitude quantizer 220 provides a quantized raw detect 222 (+1, -1) (e.g., quantized raw detect data) to the integrator 230. In some embodiments, responsive to determining that the first amplitude does not meet the threshold amplitude, the amplitude quantizer 220 may not provide an output to the integrator 230. The quantized raw detect 222 may indicate whether the first amplitude of the first sinusoidal jitter meets the amplitude threshold.

The adaptive CDR loop dynamic control circuit 120 may include one or more integrators 230A-N (herein referred to as integrator 230). The adaptive CDR loop dynamic control circuit 120 may include a timer 240. The integrator may determine a first level of confidence of the first sinusoidal jitter in the incoming data signal 170. The integrator 230 may receive the quantized raw detect 222 and a timer signal from timer 240, determine a first level of confidence of the first sinusoidal jitter (e.g., a level of confidence that the first frequency is the dominant frequency of the first sinusoidal jitter), and output a filtered detect 232 (e.g., filtered detect data). The integrator 230 may integrate the quantized raw detect 222 over time to determine the filtered detect 232. The timer 240 may reset the integrator 230 (e.g., after a threshold amount of time, after the integrator 230 determines the corresponding level of confidence). The filtered detect 232 may indicate the first frequency of the first sinusoidal jitter and the level of confidence of the first sinusoidal jitter.

The adaptive CDR loop dynamic control circuit 120 may include one or more decision quantizers 250A-N (herein referred to as decision quantizer 250). Decision quantizer 250 may include a decision threshold. Decision quantizer 250 may receive the filtered detect and a timer signal from timer 240 and may determine whether the first level of confidence of the first sinusoidal jitter meets a threshold level of confidence. The timer 240 may enable the decision quantizer 250. Responsive to determining that the first level of confidence of the first sinusoidal jitter does not meet the threshold level of confidence, the decision quantizer 250 may not provide an output to the multiplexor 260. Responsive to determining that the first level of confidence of the first sinusoidal jitter meets the threshold level of confidence, the decision quantizer 250 may provide decision quantizer output to the multiplexor 260. The decision quantizer output may indicate the first frequency of the first sinusoidal jitter (e.g., responsive to the first amplitude meeting a threshold amplitude and the first level of confidence meeting a threshold level of confidence).

The adaptive CDR loop dynamic control circuit 120 may include a multiplexor 260. The multiplexor 260 may receive decision quantizer output, default values of parameters 180 (e.g., the current values of parameters 180, etc.), and optimal values 182A-N of parameters 180 at one or more different frequencies of sinusoidal jitter. The multiplexor 260 may select the applied values 184 of parameters 180 based on the decision quantizer output and the optimal values 182 of parameters 180 (e.g., by matching the first frequency indicated by the decision quantizer output with an optimal value 182 of parameters 180 at the first frequency). The multiplexor 260 may select default values of parameters 180 responsive to not receiving a decision quantizer output. Responsive to receiving a decision quantizer output indicating a first frequency that does not correspond to one of the optimal values 182 of parameters 180, the multiplexor 260 may select the default values of parameters 180.

In some embodiments, adaptive CDR loop dynamic control circuit 120 selects the applied values 184 of parameters 180 via a component other than a multiplexor (e.g., via a look-up table, etc.).

In some embodiments, an incoming data signal 170 may have multiple instances of sinusoidal jitter that each has a different frequency. The adaptive CDR loop dynamic control circuit 120 may determine for each instance of the sinusoidal jitter, whether the sinusoidal jitter meets the threshold amplitude and the threshold level of confidence. In some embodiments, the adaptive CDR loop dynamic control circuit 120 determines which of the instances of sinusoidal jitter is the dominant jitter (e.g., has the greatest amplitude, etc.).

Figure 3:
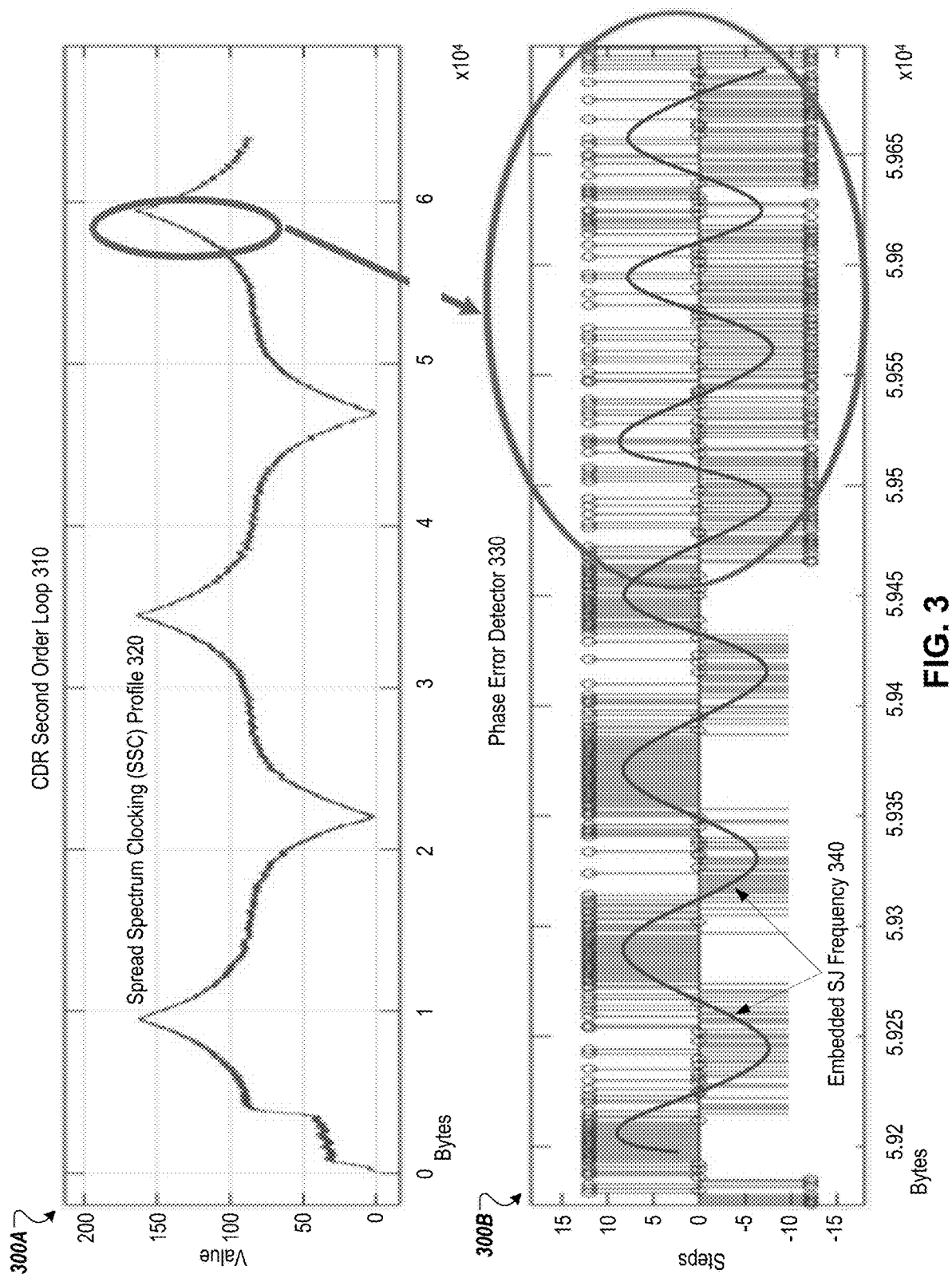
FIG. 3 is graphs illustrating detecting a sinusoidal jitter signal, according to certain embodiments.

FIG. 3 includes graphs 300A-B that illustrate detecting a sinusoidal jitter signal, according to certain embodiments. Graph 300A displays a spread spectrum clocking (SSC) profile 320 observed by a CDR second order loop 310 and graph 300B may display the phase error outputs that have embedded sinusoidal jitter (e.g., embedded SJ frequency 340) in the SSC modulated incoming data signals.

The adaptive CDR loop dynamic control circuit 120 may provide sinusoidal jitter detection. The adaptive CDR loop dynamic control circuit 120 may calculate raw detect 212 using the equation $R_{\phi,f}(n)$ based on PD output 142 ($\phi$) for a given sinusoidal frequency "f" PD outputs 142 may be buried in the noise. As shown in graphs 300A-B of FIG. 3, an embedded SJ frequency 340 (e.g., embedded SJ tone) in a SSC profile 320 is not always directly observable. For example, a SSC profile 320 may have low frequency jitters with large change in frequency over change in time ($\Delta f/\Delta t$). When the SSC modulation is quickly swinging to large values as illustrated in graphs 300A-B in FIG. 3, the embedded SJ frequency 340 is mixed with low frequency noise such that PD output 142 ($\phi$) no longer resembles the characteristics of the embedded SJ frequency 340.

The adaptive CDR loop dynamic control circuit 120 may detect the embedded SJ frequency 340. The adaptive CDR loop dynamic control circuit may remove the low frequency noise (e.g., from the SSC profile 320) by subtracting the PD outputs 142 from its runtime average ($\overline{\phi_{n,f}}$). After the subtraction, PD outputs 142 may reveal the embedded SJ frequency 340 even with a fast varying SSC profile 320.

Another source that may impact SJ detection is the higher frequency noise as seen in graphs 300A-B of FIG. 3 where the PD outputs 142 never look like a perfect SJ tone even when SSC modulation is low. The higher frequency noise may be removed by summing over a time window as defined in the equation for $R_{\phi,f}(n)$ as described above. If the raw detect 212 ($R_{\phi,f}(n)$) is positive, the raw detect 212 indicates the runtime presence of the SJ frequency 340, otherwise the SJ frequency 340 may not be present. To filter out SJ frequencies with insignificant amplitude, the raw detect 212 (e.g., output of the SJ detector 210) may be quantized against a programmable amplitude threshold (e.g., 0.1 Unit interval peak-to-peak (UIpp)), so that jitters with trivial amplitude (e.g., less than the threshold amplitude) are ignored. The quantized raw detect 222 may be integrated by using a first order low-pass loop filter over a programmable decision time window. The decision time window may be one SSC cycle (e.g., 33 microseconds (µs)). The output of the integrator 230 may be quantized against a programmable decision threshold, which is used to increase the confidence level of the jitter detection. The decision quantizer 250 may select the corresponding applied values 184 (e.g., Kp_f, Ki_f) for parameters 180 according to the SJ frequency contents. To dynamically flatten the jitter transfer curve over a frequency range, multiple frequency points across the specified range may be detected. The SJ detector 210, amplitude quantizer 220, integrator 230, and decision quantizer 250 may be instantiated for each jitter frequency. The order of the Kp/Ki multiplexor 260 selection may determine its priority if multiple significant SJ tones are detected simultaneously. The jitter frequency detection may be ordered in terms of jitter amplification magnitude in the original system. The frequency with the highest jitter amplification may have the highest priority placement in the Kp/Ki multiplexor 260 selection.

Automatic jitter sensing and adaptive control of parameters (e.g., proportional and integral gain of CDR circuits 110) may be provided by an adaptive CDR loop dynamic control circuit 120 over a range. For example the adaptive CDR loop dynamic control circuit 120 may implement multiple jitter tone detection and Kp/Ki adaption over a range of 15 MHz to 100 MHz.

Figure 4:
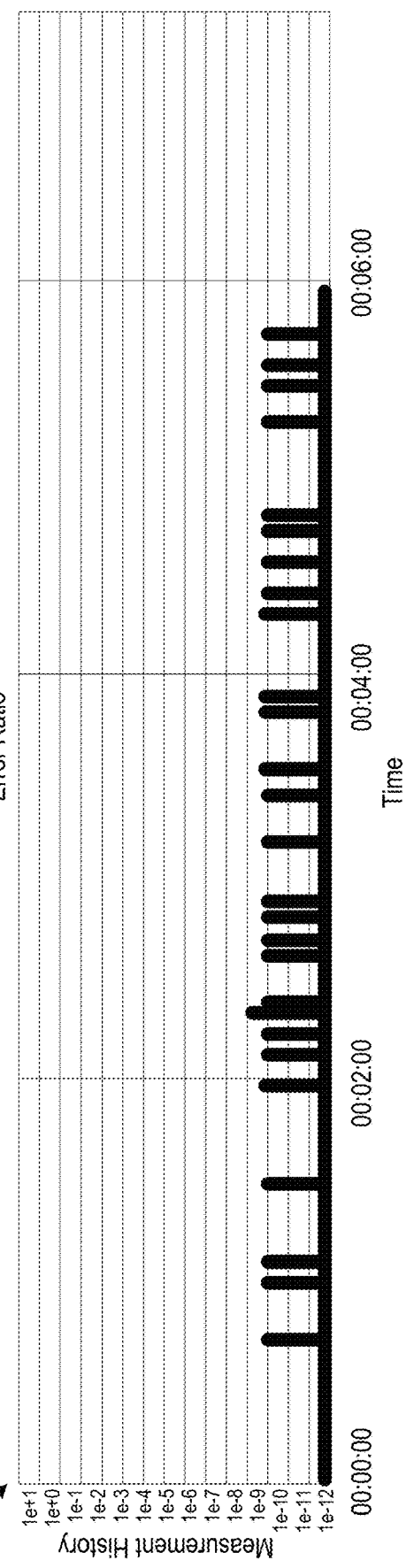
FIG. 4 is graphs illustrating bit error rate of a receiver component, according to certain embodiments.
Figure 4:
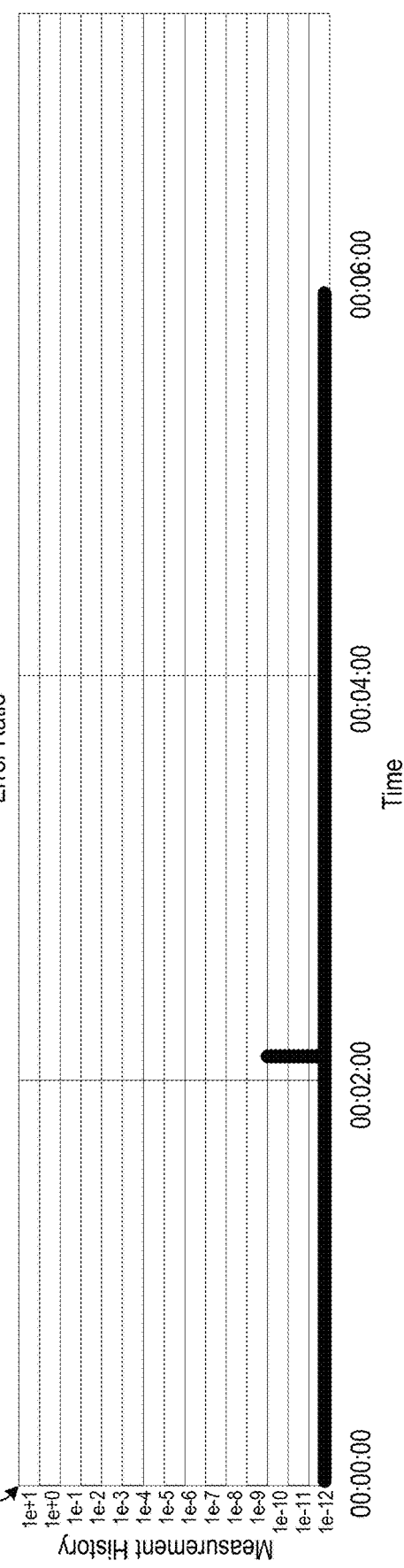
Figure 5:
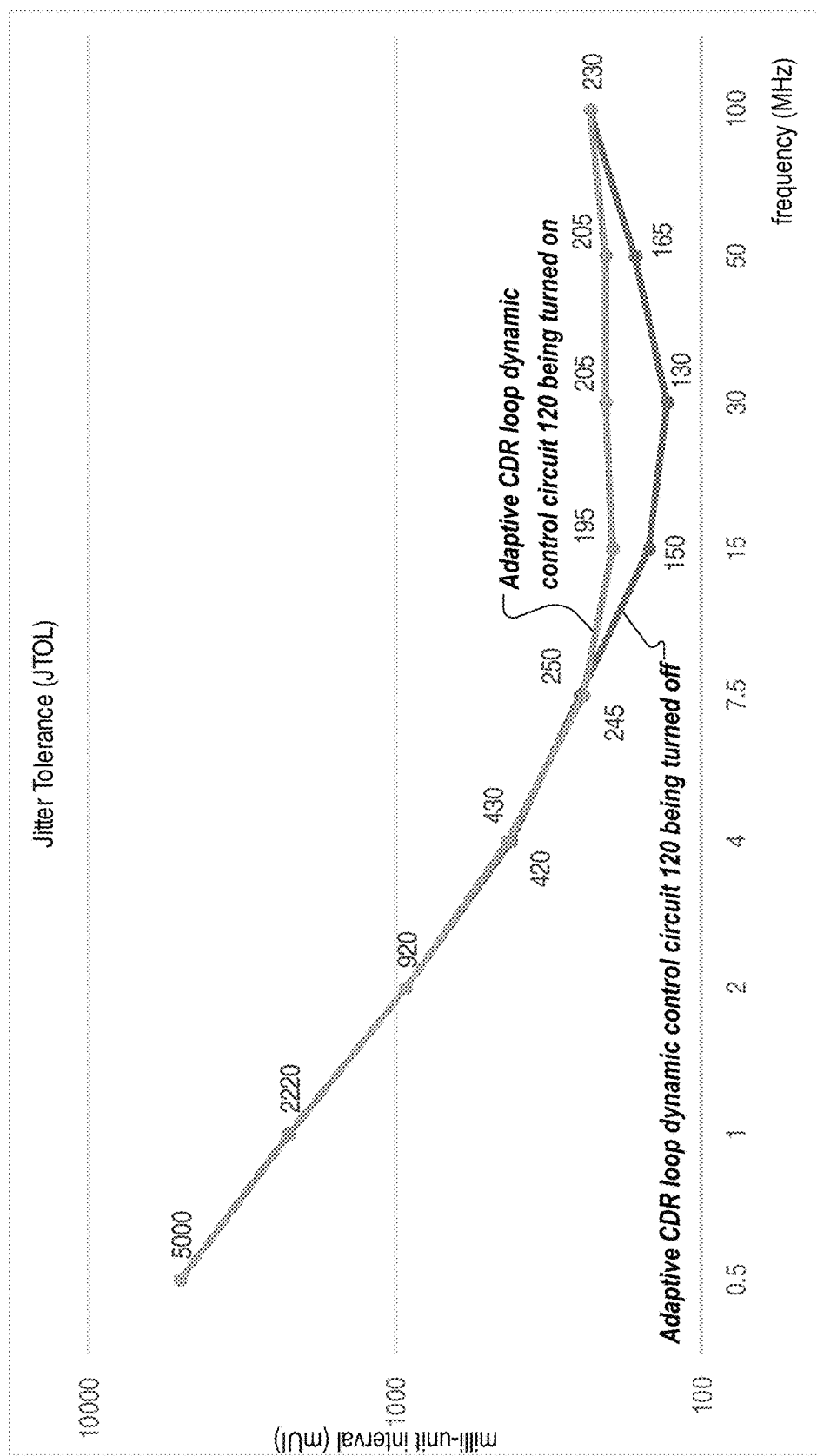
FIG. 5 is a graph illustrating jitter tolerance of a receiver component, according to certain embodiments.

FIG. 4 is graphs 400A-B illustrating bit error rate of a receiver component 100, according to certain embodiments. Graph 400A may be the bit error rate of receiver component 100 responsive to the adaptive CDR loop dynamic control circuit 120 being turned off and graph 400B may be the bit error rate of receiver component 100 responsive to the adaptive CDR loop dynamic control circuit 120 being turned on. Each spike in the error ratio (e.g., from a bit error ratio test (BERT)) may represent one error bit. A greater number of error bits (e.g., 31) may be observed in graph 400A responsive to the adaptive CDR loop dynamic control circuit 120 being disabled over a time frame (e.g., 6 minutes). A lower number of error bits (e.g., 1) may be observed in graph 400B responsive to the adaptive CDR loop dynamic control circuit 120 being turned on over the same time frame. The adaptive CDR loop dynamic control circuit 120 may reduce the BER by about 31 times. FIG. 5 is a graph 500 illustrating jitter tolerance of a receiver component 100, according to certain embodiments. Graph 500 illustrates jitter tolerance margin measured at BER=1E-12. Curve 500A may be responsive to the adaptive CDR loop dynamic control circuit 120 being turned on and curve 500B may be responsive to the adaptive CDR loop dynamic control circuit 120 being turned off (or a receiver component without an adaptive CDR loop dynamic control circuit 120). A receiver component 100 with the adaptive CDR loop dynamic control circuit 120 being turned on may improve the high frequency jitter tolerance (JTOL) greater than 50% with a flatter response in the jitter transfer function.

FIG. 6A-C are flow diagrams of a methods 600, 620, and 640 of updating parameters of a CDR circuit 110, according to certain embodiments. Methods 600, 620, and 640 may be performed by processing logic that may include hardware (e.g., circuitry, dedicated logic, programmable logic, microcode, etc.), software (such as instructions run on a processor, a general purpose computer system, or a dedicated machine), firmware, microcode, or a combination thereof. In one embodiment, methods 600, 620, and 640 may be performed, in part, by a receiver component 100. In some embodiments, a non-transitory storage medium stores instructions that when executed by a processing device of the receiver component 100 cause the processing device to perform methods 600, 620, and 640.

For simplicity of explanation, methods 600, 620, and 640 are depicted and described as a series of acts. However, acts in accordance with this disclosure can occur in various orders and/or concurrently and with other acts not presented and described herein. Furthermore, not all illustrated acts may be performed to implement the methods 600, 620, and 640 in accordance with the disclosed subject matter. In addition, those skilled in the art will understand and appreciate that the methods 600, 620, and 640 could alternatively be represented as a series of interrelated states via a state diagram or events.

FIG. 6A is a flow diagram of a method 600 of updating parameters of a CDR circuit 110, according to one embodiment.

Referring to FIG. 6A, at block 602, the receiver component 100 detects (e.g., by an adaptive CDR loop dynamic control circuit 120 of the receiver component 100) first sinusoidal jitter at a first frequency and a first amplitude. The first sinusoidal jitter may be one or more of in a first incoming data signal 170A or systematic jitter. In some embodiments, the adaptive CDR loop dynamic control circuit 120 determines the dominant jitter (e.g., of the incoming data signal, of the systematic jitter). In some embodiments, the adaptive CDR loop dynamic control circuit 120 determines a frequency of a jitter that has an amplitude that meets a threshold amplitude and that has a confidence level that meets a threshold confidence level.

At block 604, the receiver component 100 updates (e.g., by an adaptive CDR loop dynamic control circuit 120) parameters 180 of the CDR circuit 110 to first values 184 based on the first frequency and the first amplitude. The adaptive CDR loop dynamic control circuit 120 may determine the first values 184 by matching the detected frequency of the jitter to an optimal value 182 for that frequency.

At block 606, the receiver component 100 detects (e.g., by an adaptive CDR loop dynamic control circuit 120) second sinusoidal jitter at a second frequency and a second amplitude. The second sinusoidal jitter may be one or more of in a second incoming data signal 170B or systematic jitter. The adaptive CDR loop dynamic control circuit 120 may determine the jitter similar to block 602.

At block 608, the receiver component 100 updates (e.g., by an adaptive CDR loop dynamic control circuit 120) parameters 180 of the CDR circuit 110 to second of values 184 based on the second frequency and the second amplitude. The adaptive CDR loop dynamic control circuit 120 may update the parameters with the second values 184 similar to block 604.

The receiver component 100 (e.g., via adaptive CDR loop dynamic control circuit 120) may detect the sinusoidal jitter and update the values 184 of the parameters 180 of the CDR circuit 110 during live data traffic (e.g., during receiving of incoming data signals 170 by the receiver component 100 from a transmitter component). The receiver component 100 (e.g., via adaptive CDR loop dynamic control circuit 120) may detect the sinusoidal jitter and update the values 184 of the parameters 180 of the CDR circuit 110 in the presence of systematic jitter (e.g., jitter from clocking sources, from power supply noise, etc.).

FIG. 6B is a flow diagram of a method 620 of updating parameters of a CDR circuit 110, according to one embodiment.

Referring to FIG. 6B, at block 622, the receiver component 100 detects (e.g., by a sinusoidal jitter detector 210 of an adaptive CDR loop dynamic control circuit 120 of the receiver component) the first frequency of the first sinusoidal jitter. The first sinusoidal jitter may correspond to a first incoming data signal 170A. In some implementations, the first sinusoidal jitter may correspond to systematic jitter (e.g., jitter from clocking sources, from power supply noise, etc.).

At block 624, the receiver component 100 determines (e.g., by an amplitude quantizer 220 of the adaptive CDR loop dynamic control circuit 120) whether a first amplitude of the first sinusoidal jitter meets a threshold amplitude. Responsive to the first amplitude not meeting the threshold amplitude, method 620 ends. Responsive to the first amplitude meeting the threshold amplitude, method 620 continues to block 626.

At block 626, the receiver component 100 determines (e.g., by an integrator 230 of the adaptive CDR loop dynamic control circuit 120) a first level of confidence of the first sinusoidal jitter.

At block 628, the receiver component 100 determines (e.g., by a decision quantizer 250 of the adaptive CDR loop dynamic control circuit 120) whether the first level of confidence of the first sinusoidal jitter meets a threshold level of confidence. Responsive to the first level of confidence not meeting the threshold level of confidence, method 620 ends. Responsive to the first level of confidence meeting the threshold level of confidence, method 620 continues to block 630.

At block 630, the receiver component 100 determines (e.g., by a multiplexor 260 of an adaptive CDR loop dynamic control circuit 120, by a look-up table, etc.) first values 184 based on the first frequency, the first amplitude meeting the threshold amplitude, and the first level of confidence meeting the threshold level of confidence. The adaptive CDR loop dynamic control circuit 120 may identify the optimal values 182 for parameters 180 that match the first frequency of the first sinusoidal jitter and use the identified optimal values 182 as the first values 184.

At block 632, the receiver component 100 updates (e.g., by the adaptive CDR loop dynamic control circuit 120) parameters 180 of the CDR circuit 110 to the first values 184.

FIG. 6C is a flow diagram of a method 640 of updating parameters of a CDR circuit 110, according to one embodiment.

Referring to FIG. 6C, at block 642, the receiver component 100 generates (e.g., by a sampler 130 of the receiver component 100) sample data 132 responsive to receiving a first incoming data signal 170A and a first clock signal 162A. The sampler 130 may sample the first incoming data signal 170A based on the first clock signal 162A to generate the sample data 132.

At block 644, the receiver component 100 generates (e.g., by a phase detector of the receiver component 100) PD output 142 responsive to receiving the sample data 132.

At block 646, the receiver component 100 updates (e.g., by an adaptive CDR dynamic control circuit 120 of the receiver component 100), responsive to receiving the PD output 142, parameters 180 of the CDR circuit 110 to first values 184 based on a first frequency and a first amplitude of a sinusoidal jitter in the first incoming data signal 170A. Block 646 may be method 620 of FIG. 6B.

At block 648, the receiver component 100 generates (e.g., by a second digital integrator 150B of the receiver component 100) a second digital integrator output responsive to receiving a second subset 184B (e.g., Ki_a) of the first values 184 from the adaptive CDR loop dynamic control circuit 120.

At block 650, the receiver component 100 generates (e.g., by a first digital integrator 150A of the receiver component 100) a first order loop output responsive to receiving a first subset 184A (e.g., Kp_a) of the first values 184 from the adaptive CDR loop dynamic control circuit 120.

At block 652, the receiver component 100 generates (e.g., by the first digital integrator 150A) a second order loop output responsive to receiving the second digital integrator output (see block 648).

At block 654, the receiver component 100 outputs (e.g., by a phase interpolator 160 of the receiver component 100) a second clock signal 162B to the sampler 130 responsive to receiving the first order loop output and the second order loop output. The sampler may use the second clock signal 162B to generate sample data 132B responsive to receiving a second incoming data signal 170B and the second clock signal 162B.

FIG. 7 illustrates a computer system 700 with multiple interconnects, according to one embodiment. System 700 includes processor 705 and system memory 710 coupled to controller hub 715. Processor 705 includes any processing element, such as a microprocessor, a host processor, an embedded processor, a co-processor, or other processor. Processor 705 is coupled to controller hub 715 through front-side bus (FSB) 706. In one embodiment, FSB 706 is a serial point-to-point interconnect as described below. In another embodiment, FSB 706 (e.g., link) includes a serial, differential interconnect architecture that is compliant with different interconnect standards.

System memory 710 includes any memory device, such as random access memory (RAM), non-volatile (NV) memory, or other memory accessible by devices in system 700. System memory 710 is coupled to controller hub 715 through memory interface 716. Examples of a memory interface include a double-data rate (DDR) memory interface, a dual-channel DDR memory interface, and a dynamic RAM (DRAM) memory interface.

In some embodiments, one or more of 705, 710, 715, 720, 725, or 730 includes a receiver component 100 (e.g., one or more of 717, 718, 721, 722, 726, 731, etc.). In some embodiments, one or more of 705, 710, 715, 720, 725, or 730 includes a transmitter component (e.g., one or more of 717, 718, 721, 722, 726, 731, etc.). The computer system 700 may include both the receiver component 100 and the transmitter component. One or more of 705, 710, 715, 720, 725, or 730 may include an adaptive CDR loop dynamic control circuit 120 for updating parameters 180 of a CDR circuit 110 (e.g., jitter sensing and adaptive control of parameters 180 of CDR circuit 110)

In one embodiment, controller hub 715 is a root hub, root complex, or root controller. Examples of controller hub 715 include a chipset, a memory controller hub (MCH), a north bridge, an interconnect controller hub (ICH) a south bridge, and a root controller/hub. Often the term chipset refers to two physically separate controller hubs, i.e. a memory controller hub (MCH) coupled to an interconnect controller hub (ICH). Note that current systems often include the MCH integrated with processor 705, while controller 715 is to communicate with I/O devices, in a similar manner as described below. In some embodiments, peer-to-peer routing is optionally supported through root complex (e.g., controller 715).

Here, controller hub 715 is coupled to switch/bridge 720 through serial link 719. Input/output modules 717 and 721, which may also be referred to as interfaces/ports 717 and 721, include/implement a layered protocol stack to provide communication between controller hub 715 and switch 720. In one embodiment, multiple devices are capable of being coupled to switch 720.

Switch/bridge 720 routes packets/messages from device 725 upstream, i.e. up a hierarchy towards a root complex, to controller hub 715 and downstream, i.e. down a hierarchy away from a root controller, from processor 705 or system memory 710 to device 725. Switch 720, in one embodiment, is referred to as a logical assembly of multiple virtual PCI-to-PCI bridge devices. Device 725 includes any internal or external device or component to be coupled to an electronic system, such as an I/O device, a Network Interface Controller (NIC), an add-in card, an audio processor, a network processor, a hard-drive, a storage device, a CD/DVD ROM, a monitor, a printer, a mouse, a keyboard, a router, a portable storage device, a Fire wire device, a Universal Serial Bus (USB) device, a scanner, and other input/output devices. Often in the PCIe® vernacular, such as device, is referred to as an endpoint. Although not specifically shown, device 725 may include a PCIe® to PCI/PCI-X bridge to support legacy or other version PCI devices. Endpoint devices in PCIe® are often classified as legacy, PCIe®, or root complex integrated endpoints.

Graphics accelerator 730 is also coupled to controller hub 715 through serial link 732. In one embodiment, graphics accelerator 730 is coupled to an MCH, which is coupled to an ICH. Switch 720, and accordingly I/O device 725, is then coupled to the ICH. I/O modules 731 and 718 are also to implement a layered protocol stack to communicate between graphics accelerator 730 and controller hub 715. Similar to the MCH discussion above, a graphics controller or the graphics accelerator 730 itself may be integrated in processor 705.

I/O device 725 includes an interface 726 and switch/bridge 720 includes an interface 722. Interface 726 is coupled to interface 722 via serial link 723.

In one embodiment, short range wireless engines including a WLAN unit and a Bluetooth® unit may couple to processor 705 via an interconnect according to a PCIe® protocol, e.g., in accordance with the PCI Express® Specification Base Specification version 3.0 (published Jan. 17, 2007), or another such protocol such as a serial data input/output (SDIO) standard. Of course, the actual physical connection between these peripheral devices, which may be configured on one or more add-in cards, can be by way of the NGFF connectors adapted to a motherboard. Using WLAN unit, Wi-Fi® communications in accordance with a given Institute of Electrical and Electronics Engineers (IEEE) 802.11 standard can be realized, while via a unit using the Bluetooth® technology, short range communications via a Bluetooth® protocol can occur. In another embodiment, these units may communicate with processor 705 via, e.g., a USB link or a universal asynchronous receiver transmitter (UART) link.

Turning next to FIG. 8, an embodiment of a system on-chip (SOC) design in accordance with the disclosures is depicted. As a specific illustrative example, SOC 800 is included in user equipment (UE). In one embodiment, UE refers to any device to be used by an end-user to communicate, such as a hand-held phone, smartphone, tablet, ultra-thin notebook, notebook with broadband adapter, or any other similar communication device. Often a UE connects to a base station or node, which potentially corresponds in nature to a mobile station (MS) in a GSM network.

Here, SOC 800 includes 2 cores—806 and 807. Similar to the discussion above, cores 806 and 807 may conform to an Instruction Set Architecture, such as an Intel® Architecture Core™-based processor, an Advanced Micro Devices, Inc. (AMD) processor, a MIPS-based processor, an ARM-based processor design, or a customer thereof, as well as their licensees or adopters. Cores 806 and 807 are coupled to cache control 808 that is associated with bus interface unit 809 and L2 cache 804 to communicate with other parts of system 800. Interconnect 810 includes an on-chip interconnect, such as an IOSF, AMBA, or other interconnect discussed above, which potentially implements one or more aspects of the described disclosure.

Interconnect 810 (e.g., interface) provides communication channels to the other components, such as a Subscriber Identity Module (SIM) 830 to interface with a SIM card, a boot rom 835 to hold boot code for execution by cores 806 and 807 to initialize and boot SOC 800, a SDRAM controller 840 to interface with external memory (e.g. DRAM 860), a flash controller 845 to interface with non-volatile memory (e.g. Flash 865), a peripheral control 850 (e.g. Serial Peripheral Interface) to interface with peripherals, video codecs 820 and Video interface 825 to display and receive input (e.g. touch enabled input), GPU 815 to perform graphics related computations, etc. Any of these interfaces may incorporate aspects of the disclosure described herein.

In some embodiments, interconnect 810 may by coupled with a receiver component 100 for updating parameters 180 of a CDR circuit 110 (e.g., jitter sensing and adaptive control of parameters 180 of CDR circuit 110). In some embodiments, at least a portion of SOC 800 is the receiver component 100. At least a portion of the SOC 800 may be coupled to another portion of the SOC 800 for on-chip jitter tolerance testing. At least a portion of the SOC 800 may be coupled to a transmitter component via interconnect 810 for on-chip jitter tolerance testing.

In addition, the system illustrates peripherals for communication, such as a Bluetooth® module 870, 3G modem 875, GPS 885, and Wi-Fi® 885. Note as stated above, a UE includes a radio for communication. As a result, these peripheral communication modules are not all required. However, in a UE some form a radio for external communication is to be included.

The following examples pertain to further embodiments.

Example 1 is a receiver component comprising: a clock and data recovery (CDR) circuit comprising: an adaptive CDR loop dynamic control circuit to: detect first sinusoidal jitter at a first frequency and a first amplitude, wherein the first sinusoidal jitter is in a first incoming data signal; update parameters of the CDR circuit to a first plurality of values based on the first frequency and the first amplitude; detect second sinusoidal jitter at a second frequency and a second amplitude, wherein the second sinusoidal jitter is in a second incoming data signal; and update the parameters of the CDR circuit to a second plurality of values based on the second frequency and the second amplitude.

In Example 2, the subject matter of Example 1, wherein the parameters of the CDR circuit comprise a first order loop gain and a second order loop gain.

In Example 3, the subject matter of any one of Examples 1-2, wherein the adaptive CDR loop dynamic control circuit comprises a sinusoidal jitter detector to detect the first frequency of the first sinusoidal jitter.

In Example 4, the subject matter of any one of Examples 1-3, wherein the adaptive CDR loop dynamic control circuit comprises an amplitude quantizer to determine the first amplitude of the first sinusoidal jitter meets a threshold amplitude.

In Example 5, the subject matter of any one of Examples 1-4, wherein the adaptive CDR loop dynamic control circuit comprises: an integrator to determine a first level of confidence of the first sinusoidal jitter; and a decision quantizer to determine the first level of confidence of the first sinusoidal jitter meets a threshold level of confidence.

In Example 6, the subject matter of any one of Examples 1-5, wherein the adaptive CDR loop dynamic control circuit comprises: a multiplexor to determine the first plurality of values based on the first frequency, the first amplitude meeting a threshold amplitude, and a first level of confidence meeting a threshold level of confidence.

In Example 7, the subject matter of any one of Examples 1-6, further comprising: a sampler to output sample data responsive to receiving the first incoming data signal and a first clock signal; a phase detector to output phase detector output responsive to receiving the sample data, wherein the adaptive CDR loop dynamic control circuit is to output the first plurality of values responsive to receiving the phase detector output; a second digital integrator to output a second digital integrator output responsive to receiving a second subset of the first plurality of values from the adaptive CDR loop dynamic control circuit based on the first frequency and the first amplitude of the first sinusoidal jitter; a first digital integrator to output: a first order loop output responsive to receiving a first subset of the first plurality of values from the adaptive CDR loop dynamic control circuit based on the first frequency and the first amplitude of the first sinusoidal jitter; and a second order loop output responsive to receiving the second digital integrator output; and a phase interpolator to output a second clock signal to the sampler responsive to receiving the first order loop output and the second order loop output.

In Example 8, the subject matter of any one of Examples 1-7, wherein a system comprises the receiver component and one or more system components, wherein the one or more system components generate the first sinusoidal jitter, wherein the system is to adjust the first sinusoidal jitter based on the first plurality of values.

In Example 9, the subject matter of any one of Examples 1-8, wherein the adaptive CDR loop dynamic control circuit is to adaptively control proportional and integral gain of the CDR circuit based on updates to the parameters of the CDR circuit.

Example 10 is a method comprising: detecting, by an adaptive clock and data recovery (CDR) loop dynamic control circuit of a CDR circuit of a receiver component, first sinusoidal jitter at a first frequency and a first amplitude, wherein the first sinusoidal jitter is in a first incoming data signal; updating, by the adaptive CDR loop dynamic control circuit, parameters of the CDR circuit to a first plurality of values based on the first frequency and the first amplitude; detecting, by the adaptive CDR loop dynamic control circuit, second sinusoidal jitter at a second frequency and a second amplitude, wherein the second sinusoidal jitter is in a second incoming data signal; and updating, by the adaptive CDR loop dynamic control circuit, the parameters of the CDR circuit to a second plurality of values based on the second frequency and the second amplitude.

In Example 11, the subject matter of Example 10, wherein the parameters of the CDR circuit comprise a first order loop gain and a second order loop gain.

In Example 12, the subject matter of any one of Examples 10-11, further comprising: detecting, by a sinusoidal jitter detector of the adaptive CDR loop dynamic control circuit, the first frequency of the first sinusoidal jitter; determining, by an amplitude quantizer of the adaptive CDR loop dynamic control circuit, the first amplitude of the first sinusoidal jitter meets a threshold amplitude; determining, by an integrator of the adaptive CDR loop dynamic control circuit, a first level of confidence of the first sinusoidal jitter; determining, by a decision quantizer of the adaptive CDR loop dynamic control circuit, the first level of confidence of the first sinusoidal jitter meets a threshold level of confidence; and determining, by a multiplexor of the adaptive CDR loop dynamic control circuit, the first plurality of values based on the first frequency, the first amplitude meeting the threshold amplitude, and the first level of confidence meeting the threshold level of confidence.

In Example 13, the subject matter of any one of Examples 10-12, further comprising: generating, by a sampler of the receiver component, sample data responsive to receiving the first incoming data signal and a first clock signal; generating, by a phase detector of the receiver component, phase detector output responsive to receiving the sample data, wherein the adaptive CDR loop dynamic control circuit is to output the first plurality of values responsive to receiving the phase detector output; generating, by a second digital integrator of the receiver component, a second digital integrator output responsive to receiving a second subset of the first plurality of values from the adaptive CDR loop dynamic control circuit based on the first frequency and the first amplitude of the first sinusoidal jitter; generating, by a first digital integrator of the receiver component, a first order loop output responsive to receiving a first subset of the first plurality of values from the adaptive CDR loop dynamic control circuit based on the first frequency and the first amplitude of the first sinusoidal jitter; generating, by the first digital integrator of the receiver component, a second order loop output responsive to receiving the second digital integrator output; and outputting, by a phase interpolator of the receiver component, a second clock signal to the sampler responsive to receiving the first order loop output and the second order loop output.

In Example 14, the subject matter of any one of Examples 10-13, further comprising: adjusting, by a system comprising the receiver component and one or more system components, the first sinusoidal jitter based on the first plurality of values, wherein generation of the first sinusoidal jitter is by the one or more system components.

In Example 15, the subject matter of any one of Examples 10-14, further comprising: adaptively controlling, by the adaptive CDR loop dynamic control circuit, proportional and integral gain of the CDR circuit based on updates to the parameters of the CDR circuit.

Example 16 is a system comprising: a transmitter component to transmit a first data signal and a second data signal; a receiver component comprising: a clock and data recovery (CDR) circuit comprising: an adaptive clock and data recovery (CDR) loop dynamic control circuit to: detect first sinusoidal jitter at a first frequency and a first amplitude, wherein the first sinusoidal jitter is in the first data signal; update parameters of the CDR circuit to a first plurality of values based on the first frequency and the first amplitude; detect second sinusoidal jitter at a second frequency and a second amplitude, wherein the second sinusoidal jitter is in the second data signal; and update the parameters of the CDR circuit to a second plurality of values based on the second frequency and the second amplitude.

In Example 17, the subject matter of Example 16, wherein the parameters of the CDR circuit comprise a first order loop gain and a second order loop gain.

In Example 18, the subject matter of any one of Examples 16-17, wherein the adaptive CDR loop dynamic control circuit comprises: a sinusoidal jitter detector to detect the first frequency of the first sinusoidal jitter; an amplitude quantizer to determine the first amplitude of the first sinusoidal jitter meets a threshold amplitude; an integrator to determine a first level of confidence of the first sinusoidal jitter; and a decision quantizer to determine the first level of confidence of the first sinusoidal jitter meets a threshold level of confidence; and a multiplexor to determine the first plurality of values based on the first frequency, the first amplitude meeting the threshold amplitude, and the first level of confidence meeting the threshold level of confidence.

In Example 19, the subject matter of any one of Examples 16-18, wherein the receiver component further comprises: a sampler to output sample data responsive to receiving the first data signal and a first clock signal; a phase detector to output phase detector output responsive to receiving the sample data, wherein the adaptive CDR loop dynamic control circuit is to output the first plurality of values responsive to receiving the phase detector output; a second digital integrator to output a second digital integrator output responsive to receiving a second subset of the first plurality of values from the adaptive CDR loop dynamic control circuit based on the first frequency and the first amplitude of the first sinusoidal jitter; a first digital integrator to output: a first order loop output responsive to receiving a first subset of the first plurality of values from the adaptive CDR loop dynamic control circuit based on the first frequency and the first amplitude of the first sinusoidal jitter; and a second order loop output responsive to receiving the second digital integrator output; and a phase interpolator to output a second clock signal to the sampler responsive to receiving the first order loop output and the second order loop output.

In Example 20, the subject matter of any one of Examples 16-19 further comprising one or more system components, wherein the one or more system components generate the first sinusoidal jitter, wherein the system is to adjust the first sinusoidal jitter based on the first plurality of values.

Example 21 is an apparatus comprising means to perform a method of any one of Examples 10-15.

Example 22 is at least one machine readable medium comprising a plurality of instructions, when executed, to implement a method or realize an apparatus of any one of Examples 10-15.

Example 23 is an apparatus comprising means for performing the method of any one of Examples 10-15.

Example 24 is an apparatus comprising a processor configured to perform the method of any one of Examples 10-15.

Various embodiments can have different combinations of the structural features described above. For instance, all optional features of the computing system described above can also be implemented with respect to the method or process described herein and specifics in the examples can be used anywhere in one or more embodiments.

While the present disclosure has been described with respect to a limited number of embodiments, those skilled in the art will appreciate numerous modifications and variations therefrom. It is intended that the appended claims cover all such modifications and variations as fall within the true spirit and scope of this present disclosure.

In the description herein, numerous specific details are set forth, such as examples of specific types of processors and system configurations, specific hardware structures, specific architectural and micro architectural details, specific register configurations, specific instruction types, specific system components, specific measurements/heights, specific processor pipeline stages and operation etc. in order to provide a thorough understanding of the present disclosure. It will be apparent, however, to one skilled in the art that these specific details need not be employed to practice the present disclosure. In other instances, well known components or methods, such as specific and alternative processor architectures, specific logic circuits/code for described algorithms, specific firmware code, specific interconnect operation, specific logic configurations, specific manufacturing techniques and materials, specific compiler embodiments, specific expression of algorithms in code, specific power down and gating techniques/logic and other specific operational details of computer system have not been described in detail in order to avoid unnecessarily obscuring the present disclosure.

The embodiments may be described with reference to components in high speed I/O (HSIO) devices in specific integrated circuits, such as in computing platforms or microprocessors. The embodiments can also be applicable to other types of integrated circuits and programmable logic devices. For example, the disclosed embodiments are not limited to desktop computer systems or portable computers, such as the Intel® Ultrabooks™ computers, and can be also used in other devices, such as handheld devices, tablets, other thin notebooks, systems on a chip (SoC) devices, and embedded applications. Some examples of handheld devices include cellular phones, Internet protocol devices, digital cameras, personal digital assistants (PDAs), and handheld PCs. Embedded applications typically include a microcontroller, a digital signal processor (DSP), a system on a chip, network computers (NetPC), set-top boxes, network hubs, wide area network (WAN) switches, or any other system that can perform the functions and operations taught below. It is described that the system can be any kind of computer or embedded system. The disclosed embodiments can especially be used for low-end devices, like wearable devices (e.g., watches), electronic implants, sensory and control infrastructure devices, controllers, supervisory control and data acquisition (SCADA) systems, or the like. Moreover, the apparatuses, methods, and systems described herein are not limited to physical computing devices, but can also relate to software optimizations for energy conservation and efficiency. As will become readily apparent in the description below, the embodiments of methods, apparatuses, and systems described herein (whether in reference to hardware, firmware, software, or a combination thereof) are vital to a 'green technology' future balanced with performance considerations.

Although the embodiments herein are described with reference to a processor, other embodiments are applicable to other types of integrated circuits and logic devices. Similar techniques and teachings of embodiments of the present disclosure can be applied to other types of circuits or semiconductor devices that can benefit from higher pipeline throughput and improved performance. The teachings of embodiments of the present disclosure are applicable to any processor or machine that performs data manipulations. However, the present disclosure is not limited to processors or machines that perform 512 bit, 256 bit, 128 bit, 64 bit, 32 bit, or 16 bit data operations and can be applied to any processor and machine in which manipulation or management of data is performed. In addition, the description herein provides examples, and the accompanying drawings show various examples for the purposes of illustration. However, these examples should not be construed in a limiting sense as they are merely intended to provide examples of embodiments of the present disclosure rather than to provide an exhaustive list of all possible embodiments of embodiments of the present disclosure.

Although the below examples describe instruction handling and distribution in the context of execution units and logic circuits, other embodiments of the present disclosure can be accomplished by way of a data or instructions stored on a machine-readable, tangible medium, which when performed by a machine cause the machine to perform functions consistent with at least one embodiment of the disclosure. In one embodiment, functions associated with embodiments of the present disclosure are embodied in machine-executable instructions. The instructions can be used to cause a general-purpose or special-purpose processor that is programmed with the instructions to perform the steps of the present disclosure. Embodiments of the present disclosure can be provided as a computer program product or software which can include a machine or computer-readable medium having stored thereon instructions which can be used to program a computer (or other electronic devices) to perform one or more operations according to embodiments of the present disclosure. Alternatively, operations of embodiments of the present disclosure might be performed by specific hardware components that contain fixed-function logic for performing the operations, or by any combination of programmed computer components and fixed-function hardware components.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium can include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer).

A design can go through various stages, from creation to simulation to fabrication. Data representing a design can represent the design in a number of manners. First, as is useful in simulations, the hardware can be represented using a hardware description language or another functional description language. Additionally, a circuit level model with logic and/or transistor gates can be produced at some stages of the design process. Furthermore, most designs, at some stage, reach a level of data representing the physical placement of various devices in the hardware model. In the case where conventional semiconductor fabrication techniques are used, the data representing the hardware model can be the data specifying the presence or absence of various features on different mask layers for masks used to produce the integrated circuit. In any representation of the design, the data can be stored in any form of a machine readable medium. A memory or a magnetic or optical storage such as a disc can be the machine readable medium to store information transmitted via optical or electrical wave modulated or otherwise generated to transmit such information. When an electrical carrier wave indicating or carrying the code or design is transmitted, to the extent that copying, buffering, or re-transmission of the electrical signal is performed, a new copy is made. Thus, a communication provider or a network provider can store on a tangible, machine-readable medium, at least temporarily, an article, such as information encoded into a carrier wave, embodying techniques of embodiments of the present disclosure.

A module as used herein refers to any combination of hardware, software, and/or firmware. As an example, a module includes hardware, such as a microcontroller, associated with a non-transitory medium to store code adapted to be executed by the microcontroller. Therefore, reference to a module, in one embodiment, refers to the hardware, which is specifically configured to recognize and/or execute the code to be held on a non-transitory medium. Furthermore, in another embodiment, use of a module refers to the non-transitory medium including the code, which is specifically adapted to be executed by the microcontroller to perform predetermined operations. And as can be inferred, in yet another embodiment, the term module (in this example) can refer to the combination of the microcontroller and the non-transitory medium. Often module boundaries that are illustrated as separate commonly vary and potentially overlap. For example, a first and a second module can share hardware, software, firmware, or a combination thereof, while potentially retaining some independent hardware, software, or firmware. In one embodiment, use of the term logic includes hardware, such as transistors, registers, or other hardware, such as programmable logic devices.

Use of the phrase 'configured to,' in one embodiment, refers to arranging, putting together, manufacturing, offering to sell, importing and/or designing an apparatus, hardware, logic, or element to perform a designated or determined task. In this example, an apparatus or element thereof that is not operating is still 'configured to' perform a designated task if it is designed, coupled, and/or interconnected to perform said designated task. As a purely illustrative example, a logic gate can provide a 0 or a 1 during operation. But a logic gate 'configured to' provide an enable signal to a clock does not include every potential logic gate that can provide a 1 or 0. Instead, the logic gate is one coupled in some manner that during operation the 1 or 0 output is to enable the clock. Note once again that use of the term 'configured to' does not require operation, but instead focus on the latent state of an apparatus, hardware, and/or element, where in the latent state the apparatus, hardware, and/or element is designed to perform a particular task when the apparatus, hardware, and/or element is operating.

Furthermore, use of the phrases 'to,' 'capable of/to,' and or 'operable to,' in one embodiment, refers to some apparatus, logic, hardware, and/or element designed in such a way to enable use of the apparatus, logic, hardware, and/or element in a specified manner. Note as above that use of to, capable to, or operable to, in one embodiment, refers to the latent state of an apparatus, logic, hardware, and/or element, where the apparatus, logic, hardware, and/or element is not operating but is designed in such a manner to enable use of an apparatus in a specified manner.

A value, as used herein, includes any known representation of a number, a state, a logical state, or a binary logical state. Often, the use of logic levels, logic values, or logical values is also referred to as 1's and 0's, which simply represents binary logic states. For example, a 1 refers to a high logic level and 0 refers to a low logic level. In one embodiment, a storage cell, such as a transistor or flash cell, can be capable of holding a single logical value or multiple logical values. However, other representations of values in computer systems have been used. For example the decimal number ten can also be represented as a binary value of 1010 and a hexadecimal letter A. Therefore, a value includes any representation of information capable of being held in a computer system.

Moreover, states can be represented by values or portions of values. As an example, a first value, such as a logical one, can represent a default or initial state, while a second value, such as a logical zero, can represent a non-default state. In addition, the terms reset and set, in one embodiment, refer to a default and an updated value or state, respectively. For example, a default value potentially includes a high logical value, i.e. reset, while an updated value potentially includes a low logical value, i.e. set. Note that any combination of values can be utilized to represent any number of states.

The embodiments of methods, hardware, software, firmware or code set forth above can be implemented via instructions or code stored on a machine-accessible, machine readable, computer accessible, or computer readable medium which are executable by a processing element. A non-transitory machine-accessible/readable medium includes any mechanism that provides (i.e., stores and/or transmits) information in a form readable by a machine, such as a computer or electronic system. For example, a non-transitory machine-accessible medium includes random-access memory (RAM), such as static RAM (SRAM) or dynamic RAM (DRAM); ROM; magnetic or optical storage medium; flash memory devices; electrical storage devices; optical storage devices; acoustical storage devices; other form of storage devices for holding information received from transitory (propagated) signals (e.g., carrier waves, infrared signals, digital signals); etc., which are to be distinguished from the non-transitory mediums that can receive information there from.

Instructions used to program logic to perform embodiments of the disclosure can be stored within a memory in the system, such as DRAM, cache, flash memory, or other storage. Furthermore, the instructions can be distributed via a network or by way of other computer readable media. Thus a machine-readable medium can include any mechanism for storing or transmitting information in a form readable by a machine (e.g., a computer), but is not limited to, floppy diskettes, optical disks, Compact Disc, Read-Only Memory (CD-ROMs), and magneto-optical disks, Read-Only Memory (ROMs), Random Access Memory (RAM), Erasable Programmable Read-Only Memory (EPROM), Electrically Erasable Programmable Read-Only Memory (EEPROM), magnetic or optical cards, flash memory, or a tangible, machine-readable storage used in the transmission of information over the Internet via electrical, optical, acoustical or other forms of propagated signals (e.g., carrier waves, infrared signals, digital signals, etc.). Accordingly, the computer-readable medium includes any type of tangible machine-readable medium suitable for storing or transmitting electronic instructions or information in a form readable by a machine (e.g., a computer)

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics can be combined in any suitable manner in one or more embodiments.

In the foregoing specification, a detailed description has been given with reference to specific exemplary embodiments. It will, however, be evident that various modifications and changes can be made thereto without departing from the broader spirit and scope of the disclosure as set forth in the appended claims. The specification and drawings are, accordingly, to be regarded in an illustrative sense rather than a restrictive sense. Furthermore, the foregoing use of embodiment and other exemplarily language does not necessarily refer to the same embodiment or the same example, but can refer to different and distinct embodiments, as well as potentially the same embodiment.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared and otherwise manipulated. It has proven convenient at times, principally for reasons of common usage, to refer to these signals as bits, values, elements, symbols, characters, terms, numbers or the like. The blocks described herein can be hardware, software, firmware or a combination thereof.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "detecting," "updating," "determining," "integrating," "outputting," "receiving," "generating," "updating," "adjusting," "controlling," or the like, refer to the actions and processes of a computing system, or similar electronic computing device, that manipulates and transforms data represented as physical (e.g., electronic) quantities within the computing system's registers and memories into other data similarly represented as physical quantities within the computing system memories or registers or other such information storage, transmission or display devices.

The words "example" or "exemplary" are used herein to mean serving as an example, instance or illustration. Any aspect or design described herein as "example" or "exemplary" is not necessarily to be construed as preferred or advantageous over other aspects or designs. Rather, use of the words "example" or "exemplary" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Also, the terms "first," "second," "third," "fourth," etc. as used herein are meant as labels to distinguish among different elements and can not necessarily have an ordinal meaning according to their numerical designation.

What is claimed is:

1. A receiver component comprising:
a jitter detector to:
receive a first portion of a signal;
detect a dominant frequency of jitter in the first portion of the signal;
output the dominant frequency of jitter, wherein a parameter associated with the receiver component is updated based on the dominant frequency of jitter in the first portion of the signal, wherein the receiver component has a first voltage margin before the parameter is updated and has a second voltage margin after the parameter is updated, and wherein the second voltage margin is more optimized than the first voltage margin; and
receive a second portion of the signal after the parameter associated with the receiver component is updated.

2. The receiver component of claim 1 further comprising:
a control circuit to update the parameter from a first value to a second value based on the dominant frequency of jitter in the first portion of the signal, wherein the parameter is of the receiver component.

3. The receiver component of claim 2 further comprising:
a clock data recovery (CDR) circuit comprising the control circuit, wherein the parameter is of the CDR circuit.

4. The receiver component of claim 2 further comprising:
a digital integrator to provide an output based on the second value from the control circuit; and
a phase interpolator to provide a clock signal based on the output from the digital integrator, wherein the second portion of the signal is updated based on clock signal.

5. The receiver component of claim 1 further comprising:
a sampler to provide sample data based on the first portion of the signal; and
a phase detector to provide phase detector output based on the sample data, wherein the jitter detector is to provide raw detect data based on the phase detector output, wherein the raw detect data indicates the dominant frequency of jitter in the first portion of the signal.

6. The receiver component of claim 5 further comprising:
an amplitude quantizer to determine, based on the raw detect data, that an amplitude corresponding to the dominant frequency of jitter in the first portion of the signal meets a threshold amplitude, wherein the parameter associated with the receiver component is further updated based on the amplitude corresponding to the dominant frequency of jitter in the first portion of the signal.

7. The receiver component of claim 6 further comprising:
an integrator to determine, based on output of the amplitude quantizer, that a level of confidence of a value of the dominant frequency of jitter of the first portion of the signal; and
a decision quantizer to determine that the level of confidence of the value meets a threshold level of confidence.

8. The receiver component of claim 1, wherein the first portion of the signal and the second portion of the signal are part of live data traffic.

9. The receiver component of claim 1, wherein:
the receiver component has the first voltage margin responsive to receiving the first portion of the signal before the parameter is updated; and
the receiver component has the second voltage margin responsive to receiving the second portion of the signal after the parameter is updated.

10. A method comprising:
receiving, by a jitter detector of a receiver component, a first portion of a signal;
detecting, by the jitter detector, a dominant frequency of jitter in the first portion of the signal;
outputting the dominant frequency of jitter, wherein a parameter associated with the receiver component is updated based on the dominant frequency of jitter in the first portion of the signal, wherein the receiver component has a first voltage margin before the parameter is updated, and wherein the receiver component has a second voltage margin that is more optimized than the first voltage margin after the parameter is updated; and
receiving, by the jitter detector, a second portion of the signal after the parameter associated with the receiver component is updated.

11. The method of claim 10 further comprising:
updating, by a control circuit of the receiver component, the parameter from a first value to a second value based on the dominant frequency of jitter in the first portion of the signal, wherein the parameter is of the receiver component.

12. The method of claim 11, wherein a clock data recovery (CDR) circuit of the receiver component comprises the control circuit, and wherein the parameter is of the CDR circuit.

13. The method of claim 11 further comprising:
providing, by a digital integrator of the receiver component based on the second value from the control circuit, an output; and
providing, by a phase interpolator of the receiver component based on the output from the digital integrator, a clock signal, wherein the second portion of the signal is updated based on clock signal.

14. The method of claim 10 further comprising:
providing, by a sampler of the receiver component, sample data based on the first portion of the signal;
providing, by a phase detector of the receiver component, phase detector output based on the sample data; and providing, by the jitter detector, raw detect data based on the phase detector output, wherein the raw detect data indicates the dominant frequency of jitter in the first portion of the signal.

15. The method of claim 14 further comprising:

determining, by an amplitude quantizer of the receiver component based on the raw detect data, that an amplitude corresponding to the dominant frequency of jitter in the first portion of the signal meets a threshold amplitude, wherein the parameter associated with the receiver component is further updated based on the amplitude corresponding to the dominant frequency of jitter in the first portion of the signal.

16. The method of claim 15 further comprising:

determining, by an integrator of the receiver component, based on output of the amplitude quantizer, that a level of confidence of a value of the dominant frequency of jitter of the first portion of the signal; and determining, by a decision quantizer of the receiver component, that the level of confidence of the value meets a threshold level of confidence.

17. The method of claim 10, wherein the first portion of the signal and the second portion of the signal are part of live data traffic.

18. A system comprising:
a transmitter component to transmit a signal; and
a receiver component comprising:
  a jitter detector to:
    receive a first portion of the signal;
    detect a dominant frequency of jitter in the first portion of the signal;
    output the dominant frequency of jitter, wherein a parameter associated with the receiver component is updated based on the dominant frequency of jitter in the first portion of the signal, wherein the receiver component has a first voltage margin before the parameter is updated, and wherein the receiver component has a second voltage margin that is more optimized than the first voltage margin after the parameter is updated; and
    receive a second portion of the signal after the parameter associated with the receiver component is updated.

19. The system of claim 18 further comprising:
a control circuit to update the parameter from a first value to a second value based on the dominant frequency of jitter in the first portion of the signal, wherein the parameter is of the receiver component.

20. The system component of claim 19, wherein the receiver component comprises:
a clock data recovery (CDR) circuit comprising the control circuit, wherein the parameter is of the CDR circuit.

* * * * *